United States Patent [19]

Holt, Jr.

[11] 3,816,762

[45] June 11, 1974

[54] NOISE SUPPRESSION CIRCUIT

[75] Inventor: James G. Holt, Jr., Mountain View, Calif.

[73] Assignee: Fairchild Camera and Instrument Corporation, Mountain View, Calif.

[22] Filed: Jan. 2, 1973

[21] Appl. No.: 320,406

[52] U.S. Cl. .................. 307/237, 307/300, 307/303, 307/313

[51] Int. Cl. ......................... H03k 5/08, H04b 15/00

[58] Field of Search ........... 307/237, 300, 303, 313; 317/235 D, 235 E

[56] References Cited

UNITED STATES PATENTS 2,782,267 2/1957 Beck .............................. 307/313 X 2,860,260 11/1958 Sykes ............................. 307/313 X

*Primary Examiner*—John Zazworsky

*Attorney, Agent, or Firm*—Roger S. Borovoy; Alan H. MacPherson

[57] ABSTRACT

A noise suppression circuit comprising a transistor connecting the input lead of a working circuit to ground has a diode interconnecting its base and emitter regions to allow charge stored on the base-collector junction capacitance of the transistor to rapidly discharge after the disappearance of a noise signal.

19 Claims, 6 Drawing Figures

NOISE SUPPRESSION CIRCUIT

BACKGROUND OF THE INVENTION

1. Field of the Invention

This invention relates to noise suppression circuits and, in particular, to a noise suppression circuit capable of operating effectively to suppress noise pulses occurring at high repetition frequencies such as on the order of 20 MHz.

2. Description of the Prior Art

Noise suppression circuits are well known. Such circuits are used in a variety of applications ranging from automotive circuits to computer circuits where the presence of noise is likely to result in spurious operation of the equipment. One commonly used noise suppression circuit comprises a transistor switch coupling the input lead of an electrical circuit to ground. The transistor switch is arranged to conduct noise spikes to ground but to remain nonconducting in response to low frequency input signals to the circuit. Unfortunately, the base-collector junction capacitance of the noise-suppression transistor which charges to follow the potential of the input signal also follows the potential of the noise spikes and thus the noise circuit (which in essence is a low pass filter) does not function satisfactorily to conduct to ground noise spikes which occur at a rate faster than the leakage discharge time of the capacitor. Thus a problem with this prior art active low pass filter is that the base-collector junction capacitance charges to follow the voltage of the input noise. When this capacitance is charged above the threshold voltage of the working circuit following the noise suppression circuit, the active filter will not prevent a noise spike from activating the working circuit until the base-collector junction capacitance discharges.

SUMMARY OF THE INVENTION

This invention overcomes the disadvantages of the described prior art active noise suppression circuit and at the same time is capable of being implemented using monolithic semiconductor integrated circuit techniques.

According to this invention, means is provided to discharge between noise pulses the energy stored on the base-collector junction capacitance of a transistor connected to shunt noise spikes to ground.

DETAILED DESCRIPTION

Figure 1:
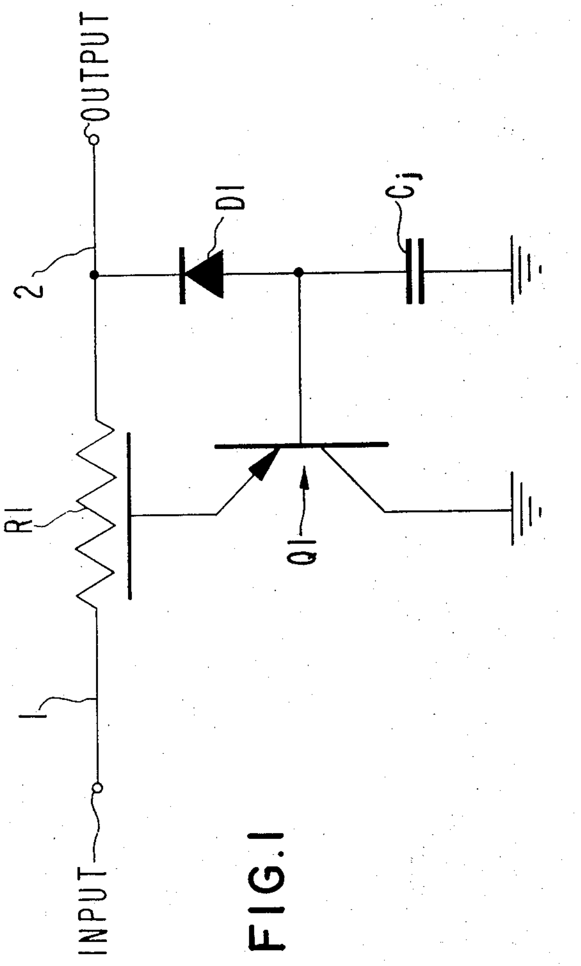
FIG. 1 is a schematic drawing of the noise suppression circuit of this invention.

The input lead to an electrical circuit is shown schematically in FIG. 1 as input lead 1. Resistor R1 connects input lead 1 to output lead 2. Output lead 2 is attached to the working circuit to be operated by the signal transmitted by input lead 1, resistor R1 and output lead 2. Resistor R1 is, as will be seen shortly from a description of the solid state semiconductor implementation of the circuit schematic shown in FIG. 1, a diffused resistor which also serves as the emitter of PNP transistor Q1. PNP transistor Q1 has its collector connected to ground and its base connected to output lead 2 by means of diode D1. Capacitor $C_j$ couples the base to ground. This capacitance is the junction capacitance associated with the collector-base junction of PNP transistor Q1 but an external capacitor could be added in parallel to $C_j$ if desired. While the capacitance $C_j$ shown in FIG. 1 depicts only the collector-base junction capacitance of Q1 such an external capacitance in parallel with $C_j$ would be represented by the same circuit schematic as shown in FIG. 1 but with a different value and symbol assigned to the capacitance denoted $C_j$.

A positive input noise pulse appears on lead 1 and travels through R1. Q1 then switches on shorting the noise pulse to ground. However, a small portion of the current generated in R1 by the noise pulse (essentially $1/\beta$ of this current where $\beta$ is the current gain of the transistor) charges the base-collector junction capacitance. Normally, in prior art circuits, this charge would leak from the capacitance through the reverse biased collector-base junction of Q1 and by any other leakage path available. However, when noise pulses appear rapidly on input lead 1, the collector-base capacitance of Q1 slowly charges increasing the magnitude of the noise on input lead 1 required to turn on transistor Q1. Thus in a particularly noisy environment, transistor Q1 becomes less and less effective and in effect is neutralized as charge builds up on its collector-base junction capacitance $C_j$. Typically the collector-base junction of a transistor such as Q1 is small, and in fact might be on the order of 10 picofarads, so little charge is required to significantly increase the voltage across capacitance $C_j$.

According to this invention, the build up of charge on the collector-base junction capacitance $C_j$ of the transistor Q1 is prevented by the addition of diode D1 between the base of Q1 and output lead 2. When a noise pulse appears on input lead 1, and across resistor R1, transistor Q1 turns on shunting most of the noise current to ground. Again, however, a small fraction ($1/\beta$) of this current charges the collector-base junction capacitance $C_j$. When the noise pulse disappears, the voltage across capacitance $C_j$ is sufficient to forward bias diode D1 thereby partially or completely discharging $C_j$ through D1 depending on the voltage on output lead 2. This discharge occurs very rapidly due to the very small amount of charge on capacitor $C_j$ and the low impedance of forward biased diode D1. Accordingly, transistor Q1 is very quickly ready to turn on again in response to the next noise pulse appearing on input lead 1.

Figure 2:
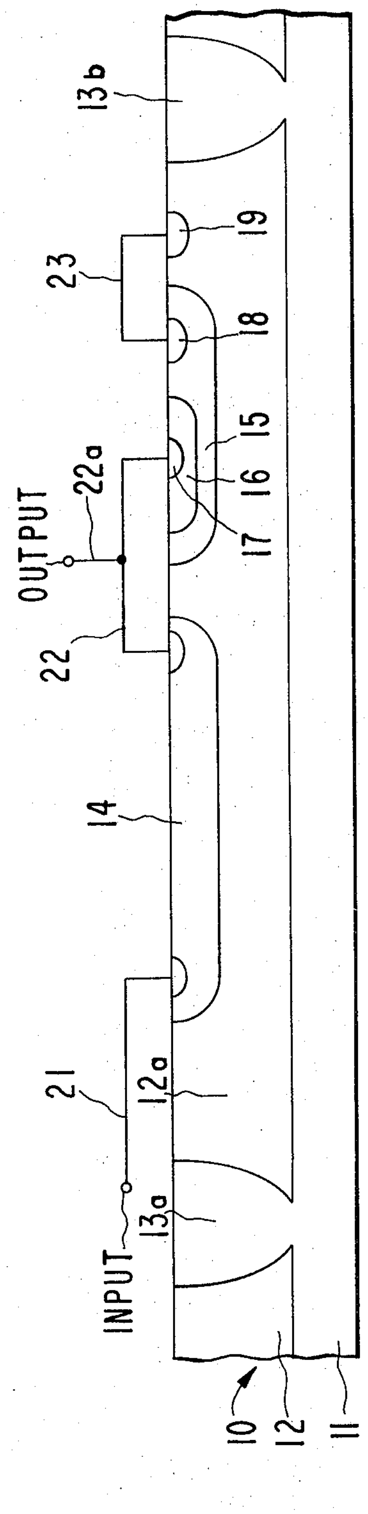
FIG. 2 shows in cross section the solid state structure implementing the circuit shown in FIG. 1.

FIG. 2 shows in cross-section a portion of the solid state integrated circuit implementation of the circuit of FIG. 1. Semiconductor substrate 11, typically P type silicon, has N type epitaxial layer 12 formed on its top surface. Hereinafter substrate 11 and the layers formed thereon will be called die 10. Islands of N type epitaxial layer 12 are electrically isolated from adjacent regions of layer 12 by the formation of diffused isolation regions of which cross sections 13*a* and 13*b* are shown in FIG. 2. These diffused isolation regions extend from the surface of epitaxial layer 12 through layer 12 to P type substrate 11. A P type region 14 is formed in the top surface of a portion of pocket 12*a* of N type epitaxial material. Electrical lead 21, corresponding to input lead 1 of FIG. 1, makes ohmic contact with the left hand portion of P type region 14. Output lead 22 makes ohmic contact to the right hand portion of P type region 14. Output lead 22*a*, corresponding to output lead 2 of FIG. 1, is in electrical contact with output lead 22. The portion of P type region 14 between leads 21 and 22 comprises resistor R1. Region 14 also serves as the emitter region of a PNP transistor wherein the base region is the N type epitaxial material of region 12*a* beneath P type region 14 and the collector region is the P type substrate 11. Capacitance $C_J$ (FIG. 1) corresponds to the junction between N type epitaxial base 12*a* and P type substrate 11.

Electrical current from a noise pulse enters the circuit shown in FIG. 2 on input lead 21, passes into the emitter region 14 and there passes across the PN junction between emitter region 14 and N type epitaxial material 12*a* into the base region of transistor Q1 (FIG. 1). Most of this charge then travels through the PN junction between N type epitaxial layer 12*a* and substrate 11 to ground. However, a small amount of charge, as described above, is stored on the PN junction between region 12*a* and substrate 11. This charge, however, then passes through N type epitaxial layer 12*a* to lead 23 entering lead 23 in ohmic contact region 19. Lead 23 connects base region 12*a* to P type region 15 formed on the top surface of N type epitaxial material 12*a*. N type region 16 is formed in one portion of P type region 15.

The PN junction between N type region 16 and P type region 15 is normally back biased, but when the voltage on the capacitance across the PN junction between N type epitaxial region 12*a* and substrate 11 rises, the P type region 15 likewise rises to this voltage and forward biases the PN junction between regions 15 and 16. Therefore, the charge stored on the PN junction between regions 12*a* and 11 flows across the PN junction between regions 15 and 16 and thus is removed from the capacitance $C_J$ of the PN junction between substrate 11 and epitaxial layer 12.

While one embodiment of this invention is shown in FIG. 1 comprising a PNP transistor connecting input lead 1 to ground, it should be understood that the complement of this circuit can also be built to provide protection against negative voltage spikes. In the complement circuit (FIG. 3), PNP transistor Q1 is replaced by NPN transistor Q2 and diode D1 is reversed in polarity and replaced by diode D2 so as to present a low impedance only during the time that output lead 2 has a voltage higher than the base of the NPN transistor. This allows the potential on capacitor $C_J$ to be discharged through diode D2 thus decreasing the negative amplitude of the noise spike required to turn on the NPN transistor Q2.

Note that transistor Q2 operates to prevent a negative spike from changing the logic level input to a working circuit from a high value to a low value thereby shutting off spuriously the working circuit connected to output lead 2. In particular, Q2 serves to shunt to the positive power supply a negative spike once the value of the input signal on lead 2 to the working circuit drops beneath the power supply voltage B+ by the voltage drop across a forward biased PN junction.

Figure 3:
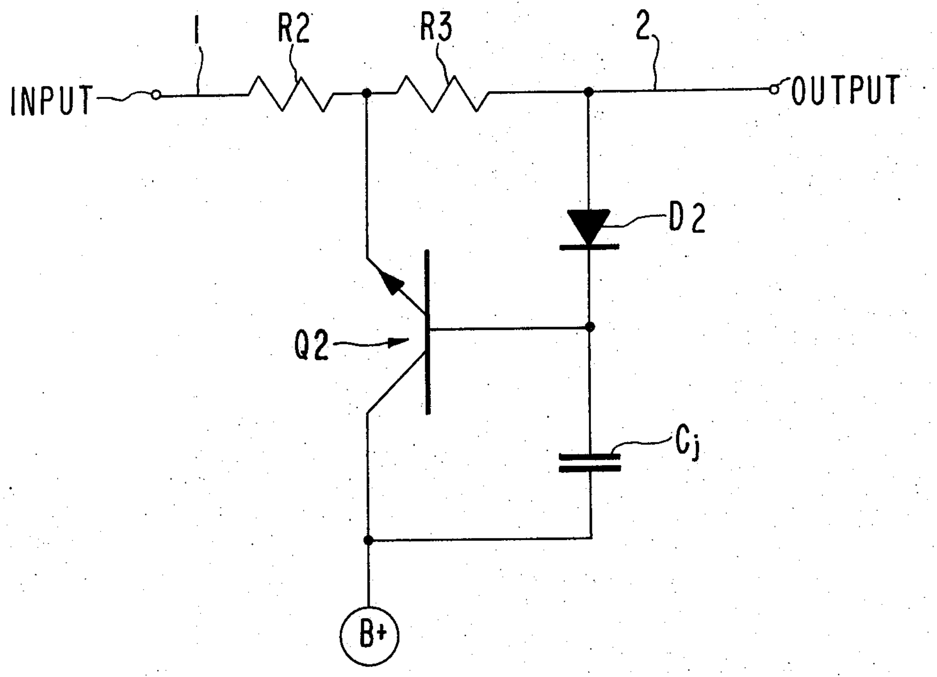
FIGS. 3 and 4 show additional embodiments of this invention.

It should also be noted that if desired, an additional capacitance external to capacitance $C_J$ can likwise be added to the structure shown in FIG. 3. Such an external capacitance can be formed on the same monolithic block of semiconductor material in which transistor Q2 is formed using well known fabrication techniques.

Figure 4:
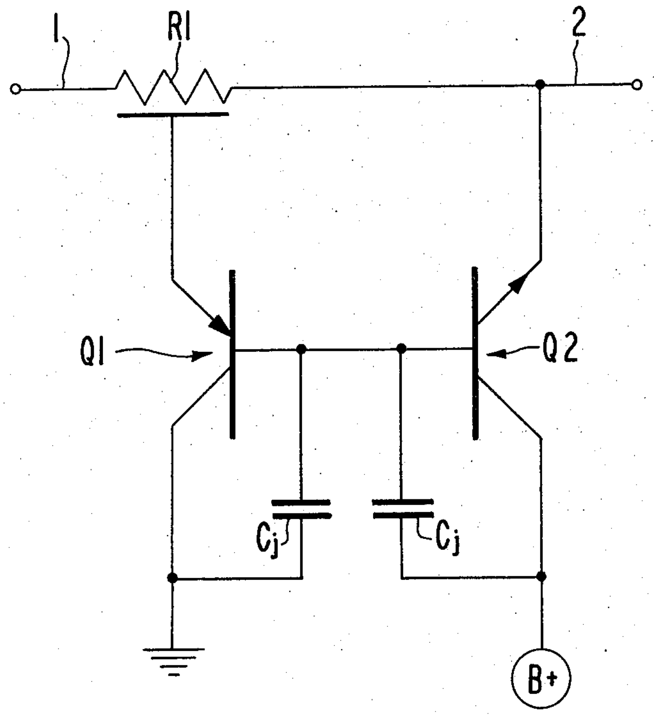

FIG. 4 shows an embodiment of this invention combining the features of the structures shown in FIGS. 1 and 3. The structure shown in FIG. 4 prevents positive noise spikes from inadvertently turning on the working circuit and prevents negative noise spikes from inadvertently turning off the working circuit. However, the PN junction between the emitter and base regions of transistor Q2 performs the same function as does diode D1 in the circuit of FIG. 1. The PN junction between the emitter and base regions OF transistor Q1 on the other hand performs the same function as does diode D2 in FIG. 3. In the circuit of FIG. 4, the capacitances $C_{JQ1}$ and $C_{JQ2}$ correspond to the junction capacitances associated with the collector-base junctions of transistors Q1 and Q2 respectively.

Figure 5:
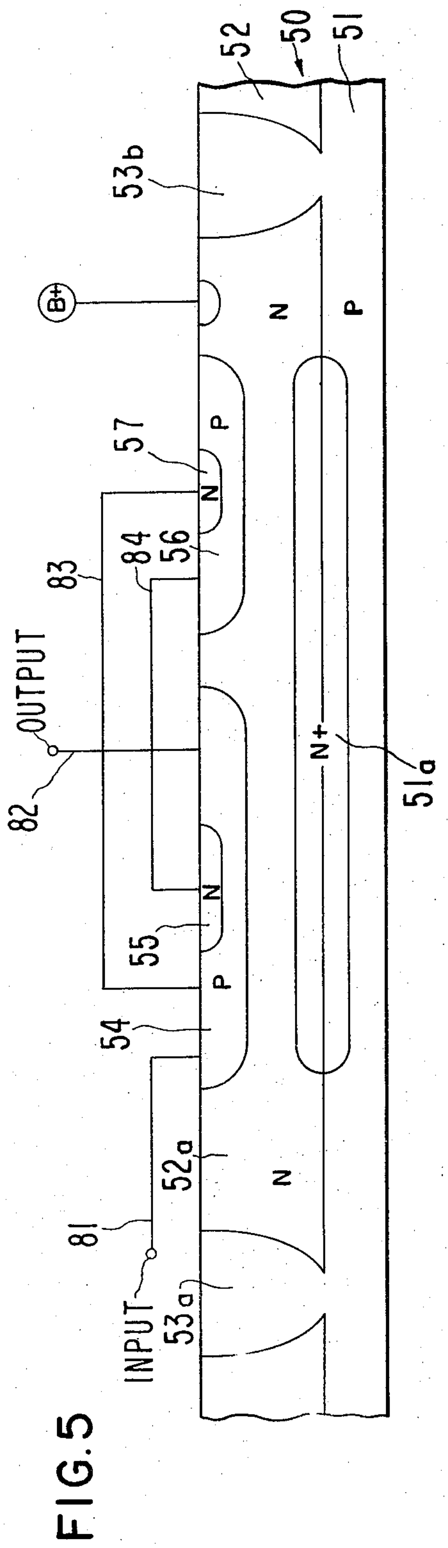
FIGS. 5 and 6 show in cross section solid state structures implementing the structures shown in FIGS. 3 and 4.

FIG. 5 shows in cross section a semiconductor embodiment of the circuit shown in FIG. 3. Substrate 51, typically P type silicon as shown, has formed on it N type epitaxial layer 52. Hereinafter, substrate 51 and the layers formed thereon will be called die 50. Islands of N type epitaxial layer 52 are electrically isolated from adjacent regions of layer 52 by the formation of diffused P type isolation regions of which cross sections 53*a* and 53*b* are shown. These diffused isolation regions extend from the surface of epitaxial layer 52 through layer 52 to P type substrate 51. A buried collector region 51*a* is formed at the interface between substrate 51 and epitaxial layer 52. This buried collector region, of a type well known, is of highly doped N type material and has a low resistivity.

A P type region 54 is formed in one portion of N type region 52*a* adjacent its top surface and P type region 56 is formed adjacent another portion of the top surface of region 52*a*. N type region 55 is then formed adjacent the top surface of P type region 54 and N type region 57 is formed adjacent the top surface of P type region 56. Electrical lead 81 corresponds to input lead 1 (FIG. 3) to the noise suppression circuit. This input lead makes ohmic contact with a portion of the P type region 54. The NPN transistor corresponding to transistor Q2 (FIG. 3) comprises collector region 52*a*, base region 56 and emitter region 57. The output lead 82 corresponding to lead 2 of FIG. 3 is taken from a portion of P type region 54. The PN junction formed between P type region 54 and N type region 55 corresponds to diode D2 of FIG. 3. P type base region 56 is connected by lead 84 to N type region 55. N type emitter region 57 is connected by lead 83 to P type region 54. Thus charge stored on the capacitance $C_J$ of the junction between the N type collector region 52*a* and the P type base region 56 is discharged through the PN junction between regions 54 and 55. The circuit is biased by the bias source B+ which makes contact to N type collector region 52*a* as shown.

Figure 6:
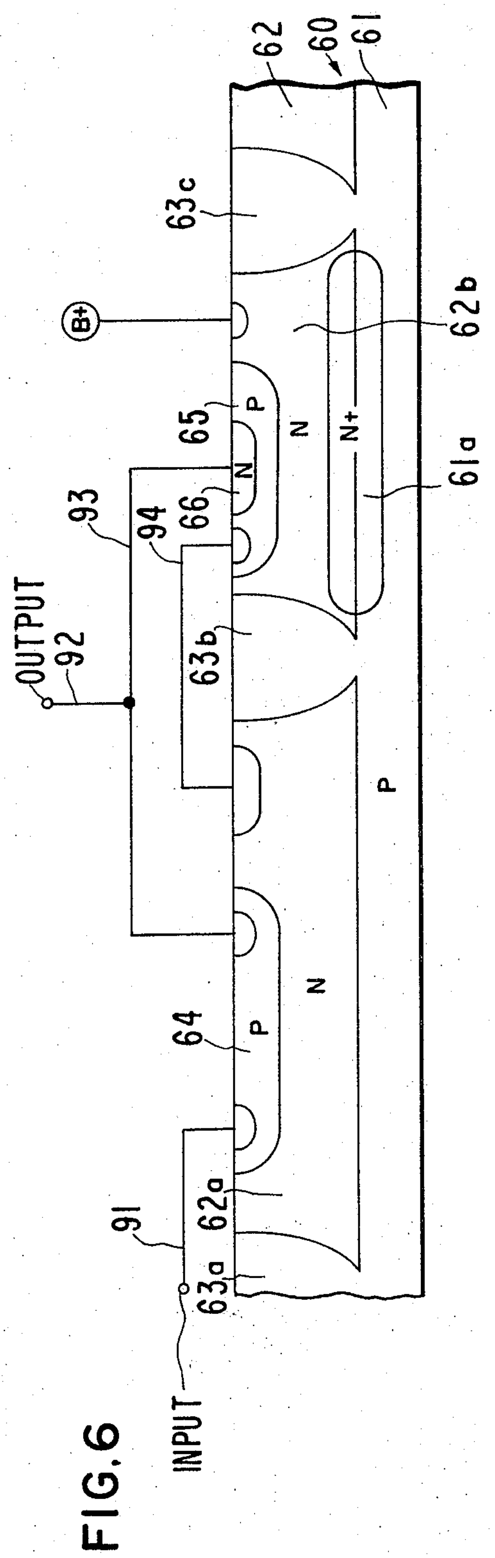

FIG. 6 shows in cross section the semiconductor implementation of the circuit shown in FIG. 4. P type substrate 61 has formed on it N type epitaxial layer 62. Hereinafter, substrate 61 and the layers formed thereon will be called die 60. Islands of N type epitaxial material 62*a* and 62*b* are isolated from each other and adjacent regions of N type material 62 by diffused isolation regions of which cross sections 63*a*, 63*b* and 63*c* are shown in FIG. 6.

An N+ buried collector region 61*a* is formed beneath pocket 62*b*. P type region 64 is formed in and adjacent the top surface of, N type region 62*a* and P type region 65 is formed in, and adjacent top surface of, region 62*b*. Lead 94 interconnects P type region 65 with region 62*a*. N type region 66 is formed in and adjacent the top surface of, P type region 65. Thus N region 62*b*, P region 65 and N region 66 comprise an NPN transistor corresponding to transistor Q2 (FIG. 4). Substrate 61 together with N region 62*a* and P region 64 comprises a PNP transistor corresponding to transistor Q1 (FIG. 4). The capacitances $C_J$ (FIG. 4) represent the capacitances associated with the PN junctions between the base and collector regions of transistors Q1 and Q2 (FIG. 4). These capacitances correspond to the capacitances of the junction between N region 62*a* and P substrate 61 for the PNP transistor and the capacitance between N region 62*b* and P type region 65 for the NPN transistor Q2. Conductive lead 93 interconnects the emitter region 66 of the NPN transistor to the P type emitter region 64 of the PNP transistor. P type resistor corresponding to resistor R1 shown in FIG. 4 is formed by contacting different portions of P type emitter region 64. Input lead 91 contacts one region of P type emitter region 64 while lead 93 connected to output lead 92 contacts another region of P type region 64. The semiconductor structure shown in FIG. 6 functions in the manner described above in conjunction with FIG. 4.

It should be noted that in the structures shown in FIGS. 2, 5 and 6, for simplicity, only the active regions of the semiconductor structures have been shown. Insulating layers have not been shown and the conductive leads necessary to interconnect the various active regions have been shown schematically only. In actual practice, of course, these conductive leads are formed in a well-known manner of conductive material adherent to the underlying insulation between the leads and the active regions of the semiconductor devices.

While the reference voltages associated with the circuits shown in FIG. 4 have been shown as ground and B+, it should be understood that this circuit will work with a wide variety of reference voltages provided that transistor Q1 is connected to a reference voltage less than the reference voltage to which transistor Q2 is connected. Thus, the collector of transistor Q1 can, for example, be connected to a negative reference potential while the collector of transistor Q2 can be connected to ground.

While several embodiments of this invention have been shown, other embodiments incorporating the principal of this invention will be obvious to those skilled in the art in view of the above disclosure.

What is claimed is:

1. A noise suppression circuit comprising in combination a first transistor the emitter of which is connected to an input lead means to a working circuit and the collector of which is connected to a first reference potential;

a second transistor the emitter of which is connected to said input lead means, the collector of which is connected to a second reference potential and the base of which is connected to the base of said first transistor;

wherein said input lead means comprises an input lead, and output lead and impedance means connecting said output lead to said input lead, said emitter of said first transistor being connected to said impedance means and said emitter of said second transistor being connected to the output lead of said input lead means.

2. Structure as in claim 1 wherein said first transistor comprises a PNP transistor, said second transistor comprises an NPN transistor, and said impedance means comprises a resistor.

3. Structure as in claim 2 wherein said resistor comprises a portion of the emitter region of said first transistor.

4. Structure as in claim 2 wherein said first reference potential is ground and said second reference potential is a selected positive voltage.

5. Structure as in claim 2 wherein said first reference potential is a selected negative voltage and said second reference potential is at ground.

6. Structure as in claim 2 wherein said first reference potential has a value less than said second reference potential.

7. Semiconductor structure comprising:

a. a substrate of semiconductor material of a first conductivity type;

b. a layer of monocrystalline semiconductor material of a second conductivity type formed on said substrate;

c. a first region of said first conductivity type formed in said layer of semiconductor material adjacent one portion of its top surface;

d. a second region of said first conductivity type formed in asid layer of semiconductor material adjacent another portion of its top surface;

e. a region of said second conductivity type formed in said second region of said first conductivity type;

f. conductive means connecting said region of said second conductivity type to said first region of said first conductivity type;

g. conductive means connecting said layer of monocrystalline semiconductor material to said second region;

h. an input lead connected to said first region; and i. an output lead means connected to another portion of said first region, whereby said first region comprises both the emitter region of a transistor and a resistor between said input lead and said output lead.

8. Structure as in claim 7 wherein said first conductivity type is P type conductivity and said second conductivity type is N type conductivity.

9. Structure as in claim 7 wherein said semiconductor material is silicon.

10. Semiconductor structure comprising:

a. a substrate of semiconductor material of a first conductivity type;

b. a layer of monocrystalline semiconductor material of a second conductivity type formed on said substrate;

c. a first region of second conductivity type formed in the top surface of said substrate of semiconductor material adjacent said layer, said first region having an impurity concentration such that it has a low resistivity;

d. a first region of said first conductivity type formed in said layer of semiconductor material adjacent its top surface;

e. a second region of said first conductivity type formed in said layer of semiconductor material adjacent another portion of its top surface;

f. a second region of said second conductivity type formed in said first region of said first conductivity type adjacent its top surface;

g. a third region of said second conductivity type formed in said second region of said first conductivity type adjacent its top surface;

h. conductive means interconnecting said first region of said first conductivity type with said third region of said second conductivity type;

i. conductive means interconnecting said second region of said first conductivity type with said second region of said second conductivity type;

j. an input lead connected to one portion of said first region of said first conductivity type;

k. an output lead connected to another portion of said first region of said first conductivity type, whereby said first region of said first conductivity type comprises a resistor and said third region of said second conductivity type comprises the emitter of a transistor;

l. a source of reference potential; and m. conductive means connecting said source of reference potential to said layer of monocrystalline semiconductor material.

11. Structure as in claim 10 wherein said first conductivity type is P type conductivity and said second conductivity type is N type conductivity.

12. Structure as in claim 10 wherein said layer of monocrystalline semiconductor material has formed in it P type diffused isolation regions extending to said substrate thereby to isolate the structure formed in said layer of monocrystalline semiconductor material from adjacent regions of said layer of monocrystalline semiconductor material.

13. Semiconductor structure comprising:

a substrate of semiconductor material of a first conductivity type;

a layer of monocrystalline semiconductor material of a second conductivity type formed on said substrate;

isolation regions of said first conductivity type extending through said layer of monocrystalline semiconductor material to said substrate thereby to form at least a first pocket and a second pocket of semiconductor material of a second conductivity type in said layer, said first pocket being substantially electrically isolated from said second pocket;

a first region of said first conductivity type formed in said first pocket adjacent to the top surface of said first pocket;

a second region of said first conductivity type formed in said second pocket adjacent a portion of the top surface of said second pocket;

a first region of second conductivity type formed in said substrate beneath said second pocket of semiconductor material, the impurity concentration of said first region being such that said first region has a low resistivity;

a second region of second conductivity type formed in said second region of said first conductivity type adjacent the top surface of said second region of said first conductivity type;

conductive means connecting said second region of said first conductivity type to the semiconductor material comprising said first pocket;

conductive means connecting said first region of said first conductivity type to said second region of said second conductivity type;

an input lead connected to a portion of said first region of said first conductivity type;

an output lead connected to another portion of said first region of said first conductivity type whereby said first region of said first conductivity type comprises both a resistor and the emitter of a first transistor, said first transistor having a base region in said first pocket and a collector region in said substrate;

a source of reference potential; and means connecting said source of reference potential to said second pocket of semiconductor material.

14. Structure as in claim 13 wherein said first conductivity type is P type conductivity and said second conductivity type is N type conductivity.

15. Structure as in claim 14 wherein said substrate is connected to a second reference potential of a value less than said first reference potential.

16. Structure as in claim 15 wherein said second reference potential is ground and said first reference potential is a selected positive voltage.

17. A noise suppression circuit comprising in combination:

a transistor, the emitter of which is connected to an input lead means of a working circuit and the collector of which is connected to a reference potential; and a diode connecting the base of said transistor to the emitter of said transistor for providing a low impedance path to discharge collector-base junction capacitance of said transisotr when the base-emitter junction of said transistor is reverse biased; wherein said input lead means comprises an input lead, an output lead, and an impedance means connecting said output lead to said input lead, said emitter of said transistor being connected to said impedance means and one lead of said diode being connected to the output lead of said input means.

18. Structure as in claim 17 wherein said transistor is a PNP transistor and said diode is connected so as to provide a low impedance path to discharge the collector-base junction capacitance of said transistor when said base is at a potential higher than said emitter.

19. Structure as in claim 17 wherein said transistor is an NPN transistor and said diode is connected so as to provide a low impedance path to discharge the collector-base junction capacitance of said transistor when said base is at a potential lower than said emitter.

* * * * *